US009066430B2

(12) United States Patent
Park

(10) Patent No.: US 9,066,430 B2
(45) Date of Patent: Jun. 23, 2015

(54) MOBILE TERMINAL WITH SEALING STRUCTURE

(71) Applicant: LG Electronics Inc., Seoul (KR)

(72) Inventor: Youngin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 148 days.

(21) Appl. No.: 14/017,216

(22) Filed: Sep. 3, 2013

(65) Prior Publication Data

US 2014/0087792 A1 Mar. 27, 2014

Related U.S. Application Data

(60) Provisional application No. 61/703,947, filed on Sep. 21, 2012.

(30) Foreign Application Priority Data

Mar. 15, 2013 (KR) ........................ 10-2013-0028198

(51) Int. Cl.
*H04M 1/00* (2006.01)
*H05K 5/06* (2006.01)
*H04M 1/02* (2006.01)
*H04M 1/18* (2006.01)

(52) U.S. Cl.
CPC ............... *H05K 5/06* (2013.01); *H04M 1/0249* (2013.01); *H04M 1/0283* (2013.01); *H04M 1/18* (2013.01); *H05K 5/061* (2013.01)

(58) Field of Classification Search
USPC ........................ 455/550.1, 575.1–575.8, 90.3, 455/347–349; 361/616, 667, 724–727, 747, 361/769; 429/97, 100; 439/500; 403/166, 403/331
See application file for complete search history.

(56) References Cited

U.S. PATENT DOCUMENTS

| | | | |
|---|---|---|---|
| 6,995,461 B2 * | 2/2006 | Soyano et al. | 257/678 |
| 2002/0047374 A1 * | 4/2002 | Yumita | 310/81 |
| 2003/0111366 A1 * | 6/2003 | Enners | 206/305 |
| 2004/0229666 A1 * | 11/2004 | Lee | 455/575.1 |
| 2010/0191299 A1 * | 7/2010 | Ayzenberg | 607/2 |
| 2011/0051572 A1 * | 3/2011 | Hozumi et al. | 368/291 |
| 2012/0031339 A1 * | 2/2012 | Ono et al. | 118/724 |
| 2013/0273985 A1 * | 10/2013 | Kageyama | 455/575.8 |

FOREIGN PATENT DOCUMENTS

| | | |
|---|---|---|
| JP | 61-244514 | 10/1986 |
| JP | 2010-182603 | 8/2010 |
| JP | 2010-234646 | 10/2010 |
| JP | 2011-104839 | 6/2011 |
| JP | 2011-119960 | 6/2011 |
| JP | 2012-175056 | 9/2012 |

OTHER PUBLICATIONS

Japan Patent Office Application Serial Number 2013-192689, Office Action dated Aug. 12, 2014, 4 pages.

* cited by examiner

*Primary Examiner* — Dominic E Rego
(74) *Attorney, Agent, or Firm* — Lee, Hong, Degerman, Kang & Waimey

(57) ABSTRACT

A mobile terminal includes a first case having a groove recessed along one region, a second case coupled to the first case to cover the one region, and a sealing member filled in the groove, the sealing member closely adhered onto the second case to seal the one region, wherein a volumetric center of the sealing member is located more adjacent to a surface of the sealing member than to an inner side of the sealing member, such that the surface of the sealing member is formed earlier than the inner side of the sealing member to prevent or reduce formation of a weld line on the surface of the sealing member.

21 Claims, 10 Drawing Sheets

MOBILE TERMINAL WITH SEALING STRUCTURE

CROSS-REFERENCE TO RELATED APPLICATION

Pursuant to 35 U.S.C. §119, this application claims the benefit of earlier filing date and right of priority to Korean Application No. 10-2013-0028198, filed on Mar. 15, 2013, and also claims the benefit of U.S. Provisional Application No. 61/703,947, filed on Sep. 21, 2012, the contents of which are all incorporated by reference herein in their entirety.

BACKGROUND OF THE INVENTION

1. Field of the Invention

This specification relates to a sealing structure between cases defining appearance of a mobile terminal.

2. Background of the Invention

Mobile terminals are electronic devices which are portable and have at least one of voice and telephone call functions, information input and/or output functions, a data storage function and the like.

As it becomes multifunctional, the mobile terminal can be allowed to capture still images or moving images, play music or video files, play games, receive broadcasts and the like, so as to be implemented as an integrated multimedia player.

Many efforts are undergoing to support and enhance various functions as such multimedia player in view of hardware or software improvements.

As one example, a plurality of cases may be coupled to define appearance of a mobile terminal. Various electronic devices may be disposed in an inner space defined by the plurality of cases. To enhance reliability of the mobile terminal, the cases should be designed to prevent external foreign materials such as dust, water and the like, from being introduced into the inner space. Therefore, a sealing structure for improving sealing efficiency between cases may be considered.

SUMMARY OF THE INVENTION

Therefore, an aspect of the detailed description is to provide a sealing structure capable of improving sealing efficiency between cases.

To achieve these and other advantages and in accordance with the purpose of this specification, as embodied and broadly described herein, there is provided a mobile terminal including a first case having a groove recessed along one region, a second case coupled to the first case to cover the one region, and a sealing member filled in the groove and closely adhered onto the second case to seal the one region, wherein a volumetric center of the sealing member may be located more adjacent to a surface of the sealing member than to an inner side of the sealing member, such that the surface of the sealing member is formed earlier than the inner side of the sealing member to prevent formation of a weld line on the surface of the sealing member.

In accordance with one aspect of the detailed description, gas which is generated due to the filling of the sealing member may be gathered toward an inner side of the groove, and a hole for discharging the gas may be formed at the inner side of the groove where the gas is gathered.

In accordance with the exemplary embodiment, the sealing member may be filled through a plurality of gates located on the groove, and the hole may be located between the adjacent gates.

In accordance with another aspect of the detailed description, a width of the groove may extend from the inner side to the surface of the groove.

In accordance with another aspect of the detailed description, the sealing member may be divided into an upper sealing portion and a lower sealing portion based on the volumetric center of the sealing member. Here, a distance between the volumetric center of the sealing member and a partial volumetric center of the upper sealing portion may be shorter than a distance between the volumetric center of the sealing member and a partial volumetric center of the lower sealing portion, such that the upper sealing portion may be first formed in the groove.

In accordance with the exemplary embodiment, the upper sealing portion may include a protruding portion protruding to elastically press the second case when the second case is coupled to the first case. Also, the protruding portion may include an inclined surface which is curved as the second case is coupled to the first case and has at least part thereof closely adhered onto the second case.

In accordance with another aspect of the detailed description, the groove may include a first groove defining an inner side of the groove, and a second groove formed on the first groove to define a surface of the groove and externally inclined such that a thickness of the sealing member formed may increase.

In accordance with the exemplary embodiment, the first groove may have a width increasing toward the second groove.

In accordance with another aspect of the detailed description, the sealing member may be filled through a plurality of gates located on the groove, and an inclined portion that the inner side of the groove is inclined toward the surface of the groove may be formed between the adjacent gates to more increase a flowing speed of the sealing member between the adjacent gates.

In accordance with the exemplary embodiment, the inclined portion may have a shape of a curved surface and/or a linear surface which is inclined toward the surface.

For example, the inclined portion may include a first inclined surface and a second inclined surface disposed with a spaced gap and both inclined toward the surface in a facing manner, and a connection surface to connect the first and second inclined surfaces to each other.

Also, a thickness of the sealing member at the inclined portion may be thinner than a thickness of the sealing member at a portion out of the inclined portion.

In accordance with another aspect of the detailed description, the first case may be formed by injecting synthetic resin, and the sealing member may be formed in the groove by double injection after injecting the first case.

In accordance with another aspect of the detailed description, the groove may be formed along an inner edge of the first case to form a closed loop.

In accordance with another aspect of the detailed description, the groove may be formed in the form of a closed loop to surround electronic devices received in the first case.

In addition, to achieve the aspect and the advantages of the present disclosure, there is provided a mobile terminal including a first case and a second case coupled to each other to define appearance of a terminal body, a groove formed along an inner edge of the first or second case, and a sealing member filled in the groove through a plurality of gates located on the groove, and pressed when the first and second cases are coupled to each other so as to seal an inner space. Here, an inclined portion that an inner side of the groove is inclined toward a surface of the groove may be formed between the adjacent gates to more increase a flowing speed of the sealing member between the adjacent gates.

In accordance with one aspect of the detailed description, the inclined portion may have a shape of a curved surface and/or a linear surface which is inclined toward the surface.

In accordance with another aspect of the detailed description, the inclined portion may include a first inclined surface and a second inclined surface disposed with a spaced gap and both inclined toward the surface in a facing manner, and a connection surface to connect the first and second inclined surfaces to each other.

In accordance with another aspect of the detailed description, a thickness of the sealing member at the inclined portion may be thinner than a thickness of the sealing member at a portion out of the inclined portion.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Description will now be given in detail of a mobile terminal according to the exemplary embodiments, with reference to the accompanying drawings.

For the sake of brief description with reference to the drawings, the same or equivalent components will be provided with the same or like reference numbers, and description thereof will not be repeated. The expression in the singular form in this specification will cover the expression in the plural form unless otherwise indicated obviously from the context.

Mobile terminals described in this specification may include cellular phones, smart phones, laptop computers, digital broadcasting terminals, personal digital assistants (PDAs), portable multimedia players (PMPs), E-books, navigators, and the like. However, it may be easily understood by those skilled in the art that the configuration according to the exemplary embodiments of this specification can be applied to stationary terminals such as digital TV, desktop computers and the like excluding a case of being applicable only to the mobile terminals.

Figure 1:
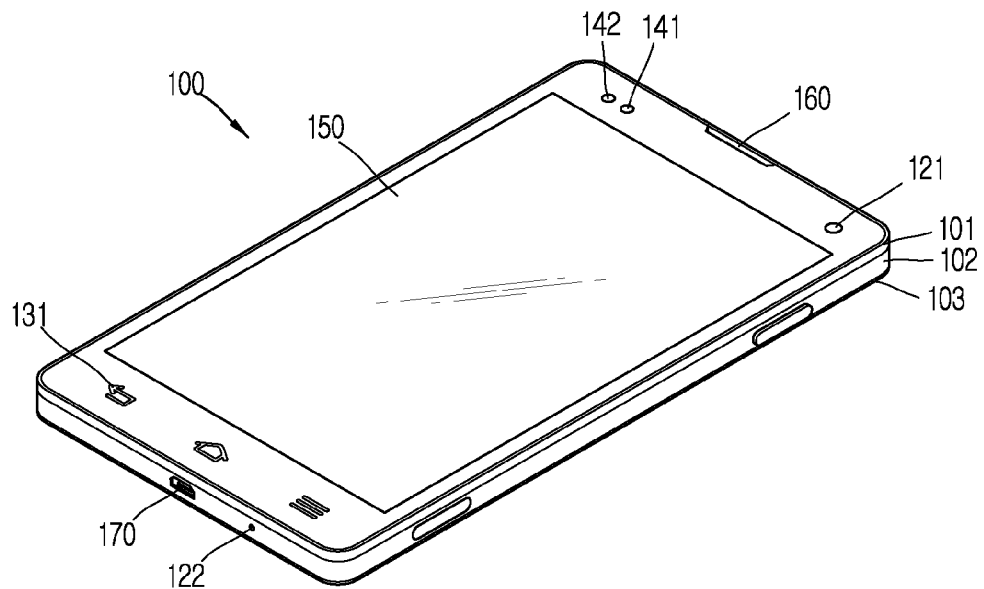
FIG. 1 is a front perspective view of a mobile terminal in accordance with one exemplary embodiment.

FIG. 1 is a front perspective view of a mobile terminal 100 in accordance with one exemplary embodiment.

Figure 2:
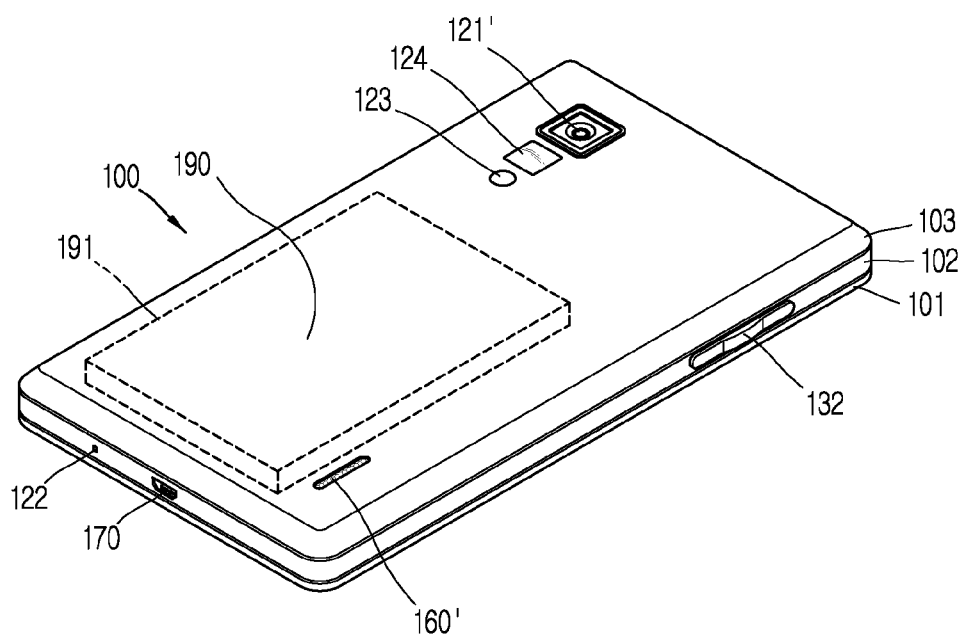
FIG. 2 is a rear perspective view of the mobile terminal shown in FIG. 1.

The mobile terminal 100 shown in FIG. 2 has a bar type terminal body. However, this detailed description may be applicable, but not limited to, a watch type, a clip type, a glass type, or various structures, such as a slide type, a folder type, a swing type, a swivel type and the like, having two or more bodies coupled to be movable relative to each other.

The terminal body may include a case (or referred to as casing, housing, cover, etc.) defining an appearance of the mobile terminal 100. In this exemplary embodiment, a main body may be divided into a front case 101 and a rear case 102. Various electronic components may be mounted in a space formed between the front case 101 and the rear case 102. A cover 103 may be coupled to the front or rear case 101 or 102 to define a rear appearance of the mobile terminal 100.

Such cases may be injected using a synthetic resin or be formed of a metal, such as stainless steel (STS), titanium (Ti), aluminum (Al) or the like.

The front surface of the terminal body is shown having a display unit 150, a proximity sensor 141, a light sensor 142, a first audio output module 160, a first camera module 121, a first manipulation unit 131 and the like, and a side surface thereof is shown having a microphone 122, an interface unit 170, a second manipulation unit 132 and the like.

The display unit 150 may output information processed in the mobile terminal 100. The display unit 150 may be implemented to display (output) visual information using, for example, at least one of a Liquid Crystal Display (LCD), a Thin Film Transistor-Liquid Crystal Display (TFT-LCD), an Organic Light-Emitting Diode (OLED), a flexible display, a three-dimensional (3D) display, an e-ink display or the like.

The display unit 150 may include a touch sensing unit for receiving a control command input in a touch manner. When a portion on the display unit 150 is touched, the touch sensing unit may sense the touch input and a content corresponding to the touched portion may be input. The contents input in the touch manner may include text or numerals or menu items which are instructed or selected in various modes.

Touch sensing unit may be transparent such that visual information output on the display unit 150 can be viewed, and have a structure for enhancing visibility of a touch screen at a bright place. In FIG. 1, the display unit 150 may occupy most of the front surface of the front case 101.

The proximity sensor 141, the light sensor 142, the first audio output module 160 and the first camera module 121 may be disposed at a region adjacent to one of both end portions of the display unit 150, and the first manipulation unit 131 and the microphone 122 may be disposed at a region adjacent to another end. A second manipulation unit 132 (see FIG. 2), an interface unit 170 and the like may be disposed at a side surface of the terminal body.

The proximity sensor 141 may detect whether or not an object exists within a predetermined detection area, and be used to control other components including the display unit 150. As one example, the proximity sensor 141 may be disposed adjacent to the display unit 150 to control the display unit 150 to be deactivated when a user puts the terminal body onto his face to place or receive a call.

The light sensor 142 may sense brightness of ambient light of the terminal body. The mobile terminal 100 may automatically adjust lighting of the display unit 150 according to an amount of ambient light using the light sensor 142.

The first audio output module 160 may be implemented as a receiver to transfer a call sound to a user's ear, or a loud speaker for outputting various alarm sounds or multimedia reproduction sounds.

Sounds generated from the first audio output module 160 may be emitted through an assembly gap between structures. Here, a separately formed hole for outputting sounds may not be viewed or be hidden from the outside, thereby more simplifying the appearance of the terminal 100.

The first camera module 121 may receive and process image frames of still pictures or video obtained by image sensors in a video call mode or a capturing mode. The processed image frames may be displayed on a display unit 150.

A user input unit may be manipulated to allow inputting of commands for controlling operations of the mobile terminal 100, and include first and second manipulation units 131 and 132. The first and second manipulation units 131 and 132 may be referred to as a manipulating portion. Such manipulating portion can employ any tactile manner that a user can touch, push, scroll or the like for manipulation.

The drawings illustrate the first manipulation unit 131 as a touch key, but the present disclosure may not be limited to the type. For example, the first manipulation unit 131 may be implemented as a mechanical key or a combination of a touch key and a push key.

Contents input by the first and second manipulation units 131 and 132 may be set variously. For example, the first manipulation unit 131 may be configured to input commands such as menu, home, cancel, search or the like, and the second manipulation unit 132 may be configured to input commands, such as a volume adjustment of sounds output from the first audio output module 160, conversion of the display unit 150 into a touch recognition mode, or the like.

The microphone 122 may receive user's voice, other sounds and the like. The microphone 122 may be disposed in various places to receive stereo sound.

The interface unit 170 may serve as a path for data exchange between the mobile terminal 100 and external devices. For example, the interface unit 170 may be at least one of wired/wireless earphone ports, ports for short-range communication (e.g., IrDA, Bluetooth, WLAN, etc.), power supply terminals for power supply to the mobile terminal and the like. The interface unit 170 may be a card socket for coupling to external cards, such as a Subscriber Identity Module (SIM), a User Identity Module (UIM), a memory card for storage of information and the like.

FIG. 2 is a rear perspective view of the mobile terminal 100 shown in FIG. 1.

Referring to FIG. 2, the rear surface of the terminal body is further shown having a second camera module 121'. The second camera module 121' faces a direction which is substantially opposite to a direction faced by the first camera module 121 (see FIG. 1). Also, the second camera module 121' may be a camera having different pixels from those of the first camera module 121.

For example, the first camera module 121 may operate with relatively lower pixels (lower resolution). Thus, the first camera module 121 may be useful when a user can capture his face and send it to another party during a video call or the like. On the other hand, the second camera module 121' may operate with relatively higher pixels (higher resolution) such that it can be useful for a user to obtain higher quality pictures for later use.

A flash 123 and a mirror 124 may be disposed adjacent to the second camera 121'. The flash 123 operates in conjunction with the second camera module 121' when taking a picture using the second camera module 121'. The mirror 124 can cooperate with the second camera module 121' to allow a user to photograph himself/herself in a self-portrait mode.

A second audio output module 160' may further be disposed on the rear surface of the terminal body. The second audio output module 160' may cooperate with the first audio output unit 160 (see FIG. 1) to provide stereo output in a phone-call mode, and be used to implement a speakerphone mode during a call connection.

A broadcast signal receiving antenna (not shown) may further be disposed at the side surface of the terminal body, in addition to an antenna for call connection. The antenna forming a part of the broadcast receiving module may be retractably inserted into the terminal body.

The terminal body is shown having a power supply unit 190 for supplying power to the mobile terminal 100. The power supply unit 190 may be implemented as a battery 191 for converting chemical energy into electrical energy, and the battery may be mounted inside the terminal body or detachably coupled to the terminal body.

Figure 3:
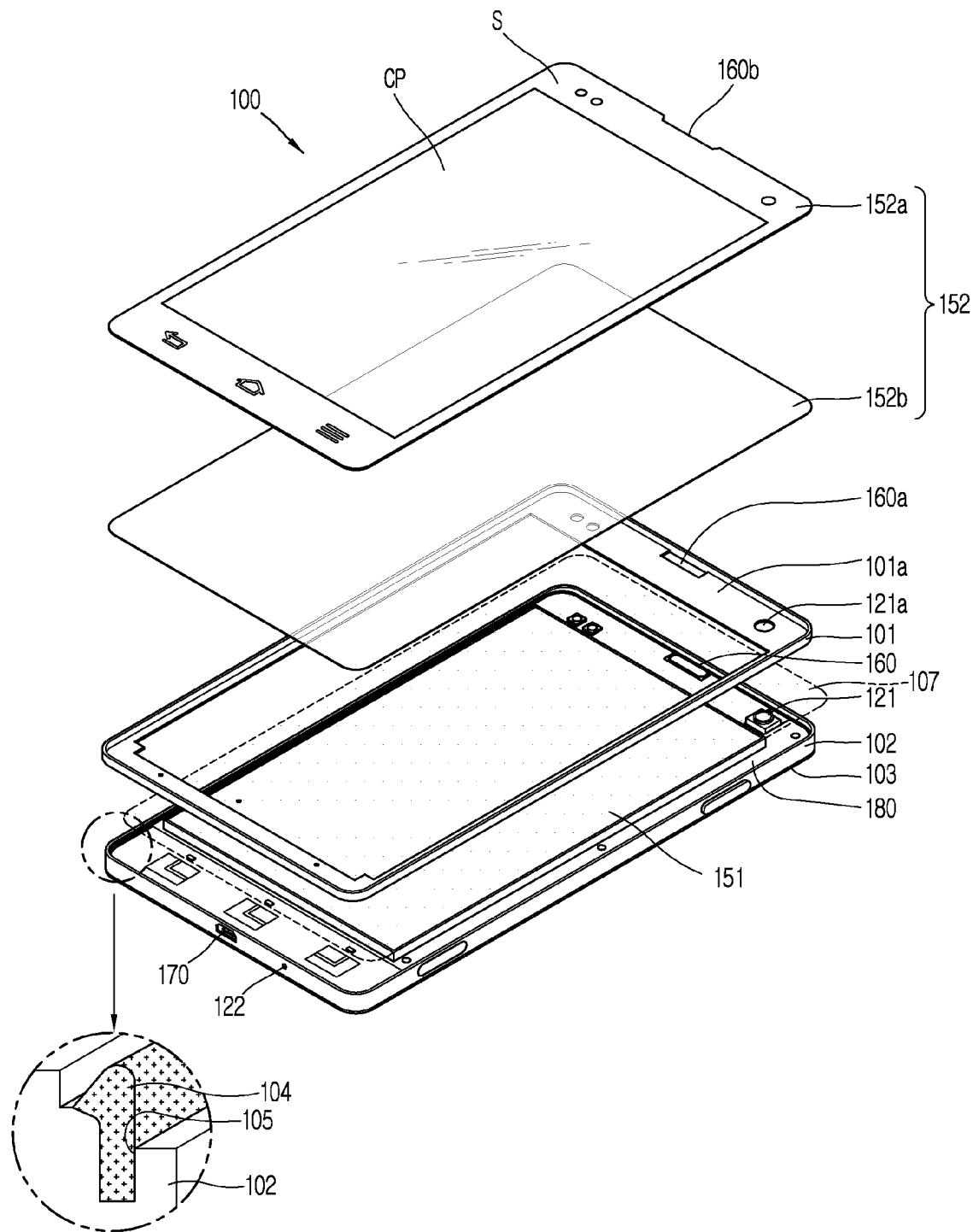
FIG. 3 is a disassembled perspective view of the mobile terminal shown in FIG. 1.

FIG. 3 is a disassembled perspective view of the mobile terminal 100 shown in FIG. 2.

As shown in FIG. 3, a printed circuit board 180 may be disposed within a terminal body. The printed circuit board 180 may be mounted onto the rear case 102 or installed on a separate inner structure. The printed circuit board 180 may be configured as one example of a controller for overall controlling various functions of the mobile terminal 100. As shown in FIG. 3, the first audio output module 160 and the first camera 121 may be mounted onto the printed circuit board 180.

The display unit 150 (e.g., FIG. 1) for displaying information processed in the mobile terminal 100 may be disposed on one surface of the terminal body. The display unit 150 may be disposed to occupy most of the front surface of the terminal body. The display unit 150 may include a display 151 and a window portion 152 covering the display 151.

The mobile terminal 100 may include a frame for receiving the display 151. This exemplary embodiment illustrates that the frame is formed on the front case 101 defining the appearance of the terminal body. Unlike the drawing, the frame may be formed as an inner structure, which is independent of the front case 101.

The front case 101 may include a mounting portion 101a. The mounting portion 101a may be recessed into one surface of the front case 101 to define a space for mounting the window portion 152 therein. The mounting portion 101a may include a hole 121a corresponding to the first camera 121 and a sound hole 160a corresponding to the first audio output module 160. The sound hole 160a may be located adjacent to a sidewall of the front case 101.

The window portion 152 may be mounted in the mounting portion 101a. A portion of the window portion 152 through which light is transmittable may have an area corresponding to the display 151. This may allow a user to recognize visual information output on the display 151 from the outside.

A recess 160b may be formed on a side surface of the window portion 152, which may form an assembly gap by being disposed to face the sidewall of the front case 101. According to the structure, a sound generated from the first audio output module 160 may be emitted along the assembly gap between the front case 101 and the window portion 152. Therefore, without visually viewing a hole which is separately formed to output sounds, the appearance of the mobile terminal 100 may be more simplified.

The display 151 may be located on a rear surface of the window portion 152 and received in the front case 101 so as to configure the display unit 151 together with the window portion 152. The display 151 may be electrically connected to the printed circuit board 180 so as to output visual information under the control of the controller. The display 151 may have an area corresponding to the light-transmittable portion of the window portion 152.

The display 151, for example, may be at least one of a Liquid Crystal Display (LCD), a Thin Film Transistor-Liquid Crystal Display (TFT-LCD), an Organic Light-Emitting Diode (OLED), a flexible display, a three-dimensional (3D) display, and the like.

The window portion 152 may include a window 152a which is light-transmittable, and a touch sensor 152b located on one surface of the window 152a to sense a touch input applied onto the window 152a.

The window 152a may be made of a light transmittable material, for example, transparent synthetic resin, tempered glass and the like. The window 152a may include a portion through which light is not transmittable.

The window 152a may be divided into an edge region S which is processed to be opaque, and a central region CR surrounded by the edge region S. The edge region S may be received and supported in the mounting portion 101a, and the central region CR may have an area corresponding to the display 151.

The touch sensor 152b may convert the change in a voltage or electrical charge generated on a particular portion of the window 152a into an electrical input signal. The touch sensor 152b may have a conductive pattern which is patterned in a manner of depositing or printing a conductive material onto a film. Examples of the conductive material may include indium tin oxide (ITO), carbon nano tube (CNT), conductive polymer, $In_2O_3$, $Sno_2$, Au and the like.

As such, the display 151 and the window portion 152 may form the display unit 150, and also be modularized into one assembly. Especially, when the window portion 152 includes the touch sensor 152b, the display unit 150 may operate as a touch screen.

To improve reliability of the mobile terminal 100, the mobile terminal 100 may have a sealing structure for preventing external foreign materials, such as dust, water and the like, from being introduced into a particular inner space. Hereinafter, a sealing structure capable of improving sealing efficiency between cases will be described in more detail.

Figure 4:
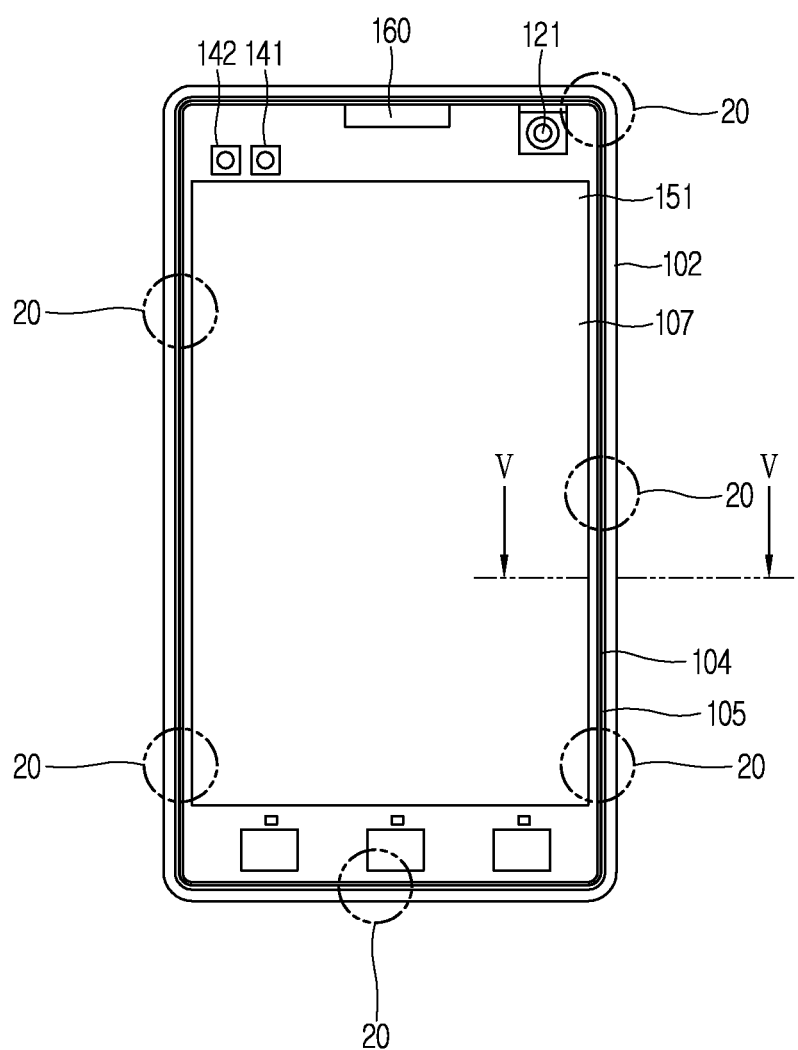
FIG. 4 is a planar view of a rear case shown in FIG. 3.
Figure 5:
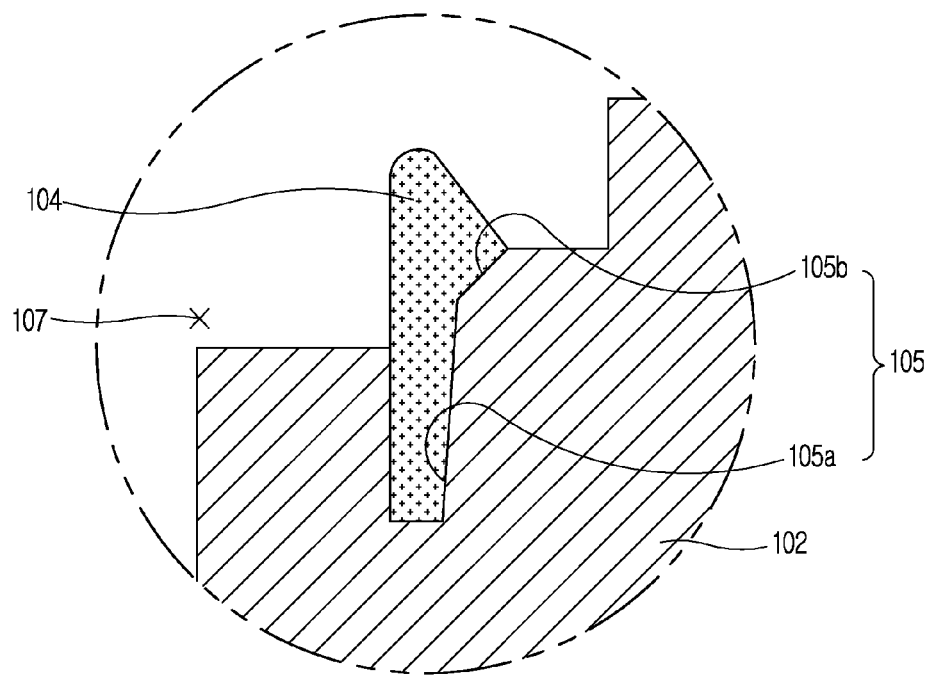
FIG. 5 is a sectional view taken along the line V-V of FIG. 4.
Figure 6A:
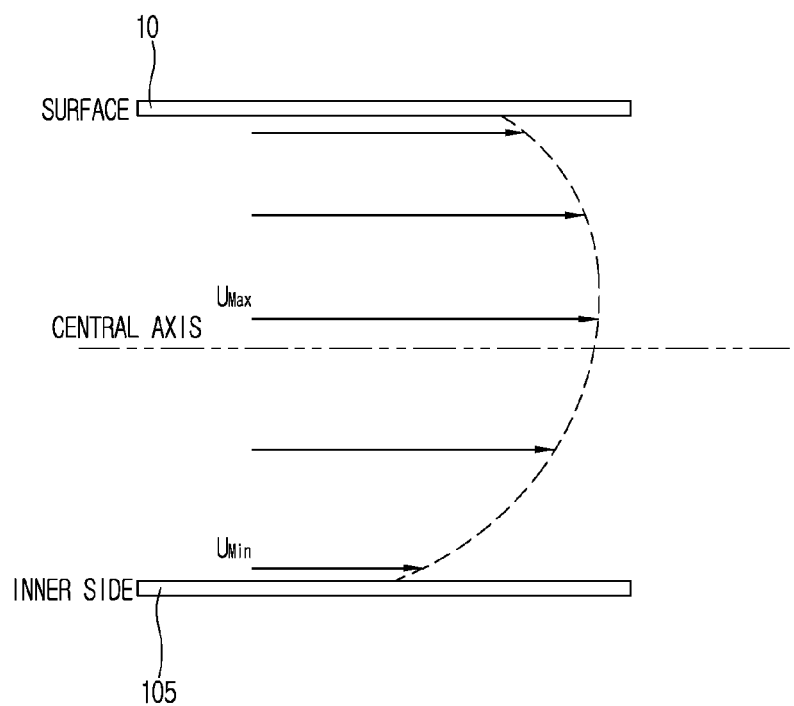
FIG. 6A is a conceptual view showing a moving speed of a sealing member filled.
Figure 6B:
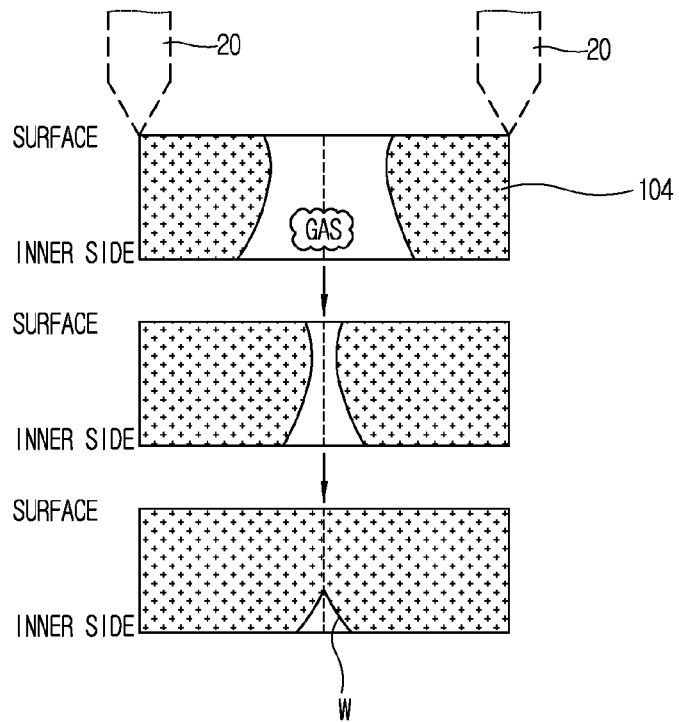
FIG. 6B is a conceptual view showing a process of filling the sealing member.

FIG. 4 is a planar view of the rear case 102 shown in FIG. 3, FIG. 5 is a sectional view taken along the line V-V of FIG. 4, FIG. 6A is a conceptual view showing a moving speed of a sealing member 104 filled, and FIG. 6B is a conceptual view showing a process of filling the sealing member 104.

As shown in FIGS. 4 and 5 together with FIG. 3, a groove 105 may be recessed along one region 107 of the rear case 102. The one region 107 may be a sealing region for preventing a permeation of external foreign materials such as dust, water and the like. The one region 107 may include mounting regions for various electronic devices. Those drawings illustrate that the groove 105 extends along an inner edge of the rear case 102 to form a closed loop and various electronic devices are mounted in the groove.

The front case 102 having the window portion 152 mounted therein may be coupled to the rear case 102 to cover the one region 107. Various electronic devices and structures may be installed in an inner space which is limited as the window portion 152, the front case 101 and the rear case 102 are coupled to each other. Here, the inner space limited by the one region 107 may form a hermetically sealed space.

A sealing member 104 may be filled in the groove 105. The sealing member 104 may be closely adhered onto the front case 101 to hermetically seal the one region. Here, after molding the rear case 102 by injecting synthetic resin, a sealing member 104 may be filled into the groove 105 in a manner of double injection. Accordingly, the rear case 102 to which the sealing member 104 is coupled may be formed. With employing such a process, a process of molding the sealing member 104 separately and assembling the sealing member 104 to the groove 105 may be unnecessarily carried out. Accordingly, a fabricating cost may be reduced. The sealing member 104 may preferably be formed of an elastically transformable material (for example, robber, silicon, etc.).

After the molded rear case 102 is coupled onto a mold 10 (see, e.g., FIG. 6A) for double injection of the sealing member 104, the sealing member 104 may be filled in the groove 105 through a plurality of gates 20 disposed on the groove 105. FIG. 4 illustrates that the plurality of gates are disposed on the groove 105 with being spaced by predetermined gaps. The sealing member 104 may flow out in a melted state from each gate 20 and injected into a type of duct which is limited by the groove 105 and the mold 10.

Here, a portion where flowing front ends of the sealing member 104 are joined and welded may be formed between the adjacent gates 20. When the surface of the sealing member 104 is not fully formed, a weld line may be problematically formed on the surface of the sealing member 104. This may result from a low flowing speed of the sealing member 104 near the surface of the sealing member 104 due to high sheer stress on the surfaces of the groove 105 and the mold 10. Analyzing this in more detail, it may be noticed that a portion where the lowest sheer stress is generated within the duct, namely, a portion where the fastest moving speed of the sealing member 104 is exhibited is a volumetric center C of the sealing member 104. This can also be confirmed that the sealing member 104 is first filled at an inner side of the groove 105 and later filled up to the surface of the groove 105 when the volumetric center C of the sealing member 104 is close to the inner side of the sealing member 104.

This problem may be overcome by designing the volumetric center C to be located adjacent to the surface of the sealing member 104 rather than the inner side of the sealing member 104. Accordingly, the surface of the sealing member 104 may be formed earlier than the inner side of the sealing member 104, thereby preventing the weld line formed on the surface of the sealing member 104.

In order for the volumetric center C of the sealing member 104 to be located adjacent to the surface of the sealing member 104, the groove 105 may have a width which extends from its inner side toward its surface. FIG. 5 exemplarily illustrates that the groove 105 includes a first groove 105a and a second groove 105b. The first groove 105a may form the inner side of the groove 105, and the second groove 105b may be formed on the first groove 105a to form the surface of the groove 105. The first and second grooves 105a and 105b may be formed such that their widths can increase toward the surface of the groove 105. According to the structure, a cross section of the sealing member 104 to be formed may increase toward the surface of the groove 105, and thus the volumetric center C of the sealing member 104 may be located adjacent to the surface of the sealing member 104.

Referring to FIGS. 6A and 6B, the volumetric center C of the sealing member 104 may be located adjacent to the mold 10 within a type of duct, which is defined by the groove 105 and the mold 10. Accordingly, the sealing member 104 may flow faster at its surface than at its inner side, thereby being formed at the surface earlier than at the inner side.

Here, a phenomenon that gas is gathered at the inner side of the duct may be caused due to a difference of a flowing speed between the surface and the inner side of the sealing member 104. Accordingly, the sealing member 104 may not be introduced into the inner side in which the gas is gathered, which may result in formation of a weld line W. That is, by shifting the weld line generated on the surface of the sealing member 104 to the inner side of the duct, reliability of the sealing structure can be improved.

Figure 7:
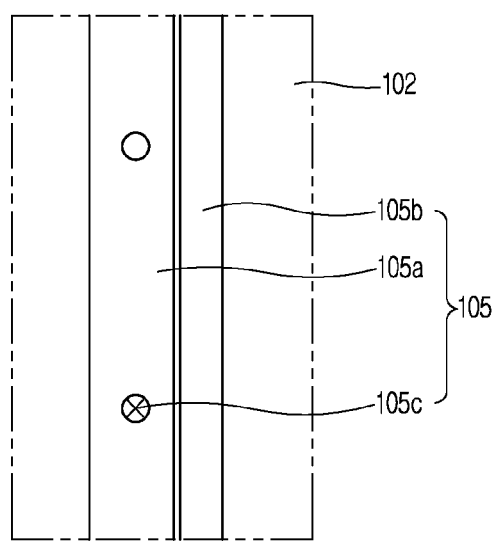
FIG. 7 is a top view of a groove shown in FIG. 5.

FIG. 7 is a top view of a groove shown in FIG. 5.

Referring to FIG. 7 together with FIG. 6B, as aforementioned, gas generated in response to filling the sealing member 104 may be gathered at the inner side of the groove 105. To discharge the gas, a hole 105c may be formed at the inner side of the groove 105. The hole 105c may be located between the adjacent gates 20, and an accurate position of the hole 105c may be decided by considering the flowing speed of the sealing member 104 and the shape of the groove 105. For example, when the sealing member 104 is filled in the groove 105 through the plurality of gates 20 at the same speed and the shape of the groove 105 is symmetrical, the hole 105c may be located in the middle between the adjacent gates 20.

Figure 8A:
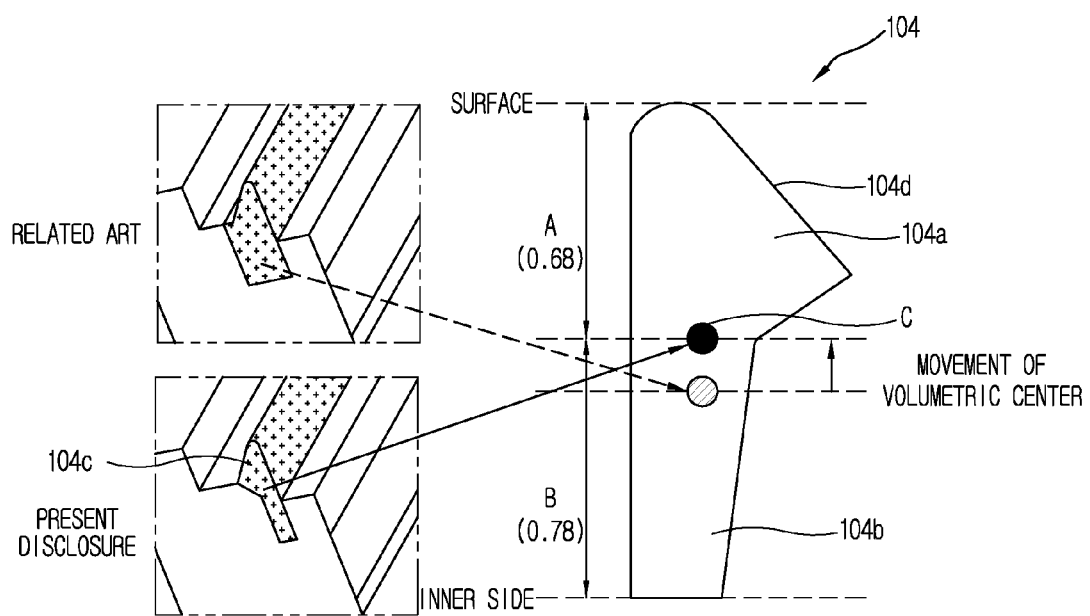
FIG. 8A is a conceptual view showing a movement of a volumetric center of the sealing member, as compared with the related art.
Figure 8B:
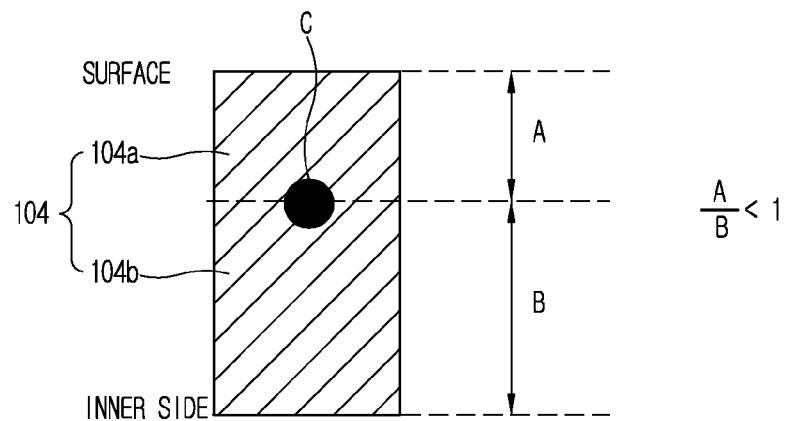
FIG. 8B is a conceptual view of a design guide for filling the sealing member on a surface earlier than on an inner side.

FIG. 8A is a conceptual view showing shifting of the volumetric center C of the sealing member 104, as compared with the related art, and FIG. 8B is a conceptual view of a design guide for filling the sealing member 104 at a surface earlier than at an inner side of the groove 105.

Referring to FIGS. 8A and 8B, most of volume of the related art sealing member 104 (upper left box in FIG. 8A) occupies the lower portion of the sealing member 104, and accordingly the volumetric center C is located more adjacent to the inner side of the sealing member 104 than to the surface of the sealing member 104. However, most of volume of the sealing member 104 according to the exemplary present disclosure (lower left box in FIG. 8A) may occupy an upper portion of the sealing member 104, other than the lower portion thereof. Accordingly, the volumetric center C of the sealing member 104 may be located more adjacent to the surface of the sealing member 104 than to the inner side of the sealing member 104 as in the related art.

Consequently, it may be understood, based on analysis of the aforementioned sheer stress and flowing speed, the surface of that the sealing member 104 is formed earlier than the inner side thereof. Therefore, a non-formation of the sealing member 104 or the formation of the weld line on the surface of the sealing member 104, which might be generated in the related art sealing structure, may be overcome.

Proposing a design guide for this, a distance A between the volumetric center C and the surface of the sealing member 104 should be shorter than a distance B between the volumetric center C and the inner side of the sealing member 104, namely, the volumetric center C should be located more adjacent to the surface than to the inner side of the sealing member 104. With this general principle in mind, a number of variations and configurations of the sealing member 104 can be contemplated without departing from the spirit or scope of the present disclosure.

Figure 9A:
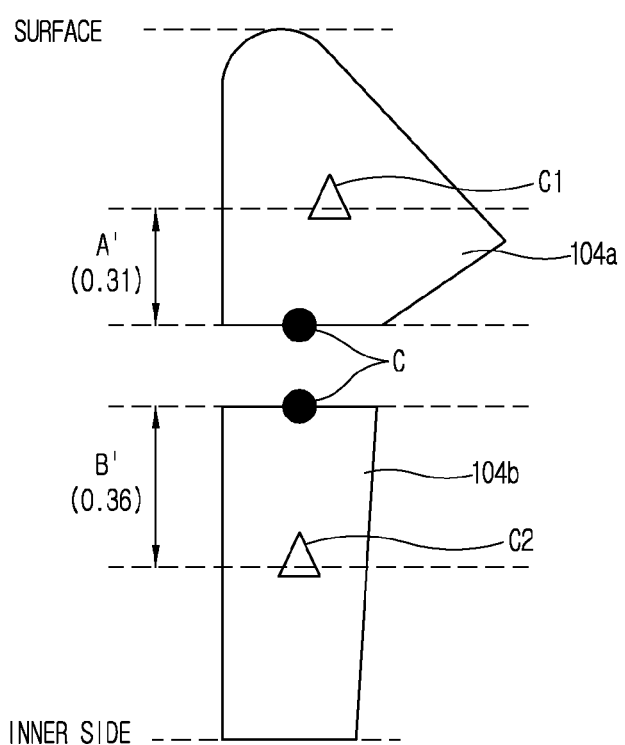
FIG. 9A is a conceptual view showing a result of comparing distances from partial volumetric centers of upper and lower sealing portions, which are divided based on the volumetric center, to the volumetric center.
Figure 9B:
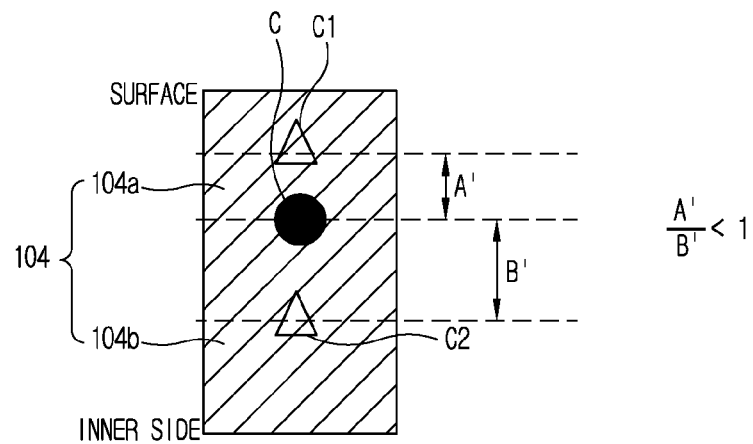
FIG. 9B is a conceptual view of an additional design guide for filling the sealing member on the surface earlier than on the inner side.

FIG. 9A is a conceptual view showing results of comparing distances A' and B' from partial volumetric centers C1 and C2 of upper and lower sealing portions 104a and 104b, which are divided based on the volumetric center C, to the volumetric center C, and FIG. 9B is a conceptual view of an additional design guide for filling the sealing member 104 at the surface earlier than at the inner side of the groove 105.

Referring to FIGS. 9A and 9B, the sealing member 104 may be divided into an upper sealing portion 104a and a lower sealing portion 104b based on the volumetric center C. In order for the upper sealing portion 104a to be first filled in the groove 105, in addition to the aforementioned design guide, the distance A' from the volumetric center C of the sealing member 104 to the partial volumetric center C1 of the upper sealing portion 104a may preferably be shorter than the distance B' from the volumetric center C of the sealing member 104 to the partial volumetric center C2 of the lower sealing portion 104b.

Figure 10:
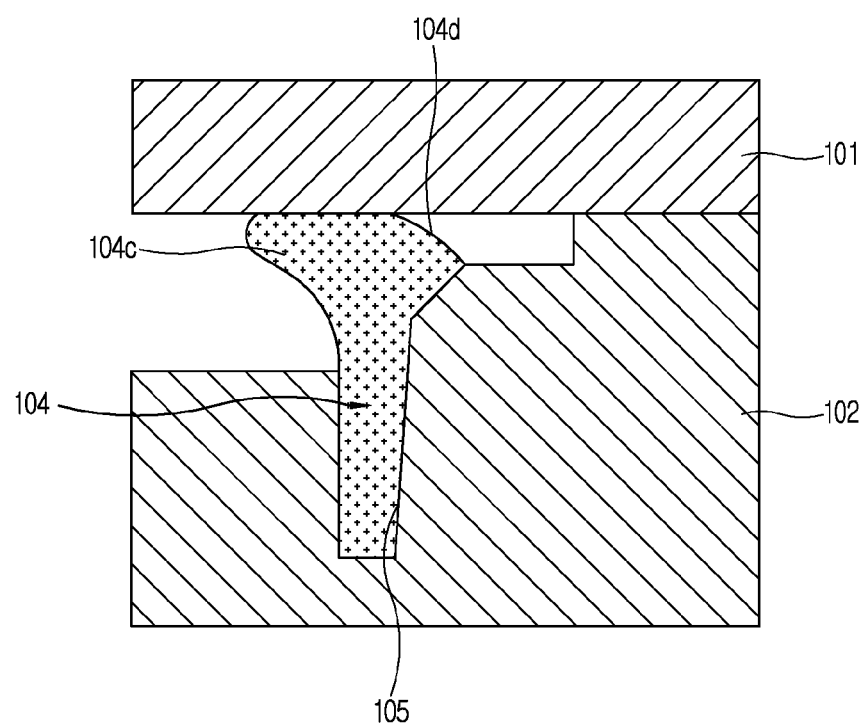
FIG. 10 is a conceptual view showing that an inclined surface of a protruding portion is closely adhered onto a front case when the front case is coupled to a rear case.

FIG. 10 is a conceptual view showing that an inclined surface 104d of a protruding portion 104c is closely adhered onto the front case 101 when the front case 101 is coupled to the rear case 102.

Referring to FIG. 10 together with FIG. 8A, the upper sealing portion 104a may include a protruding portion 104c which is protruding to elastically press the front case 101 when the front case 101 is coupled to the rear case 102. The protruding portion 104c may be a portion which forms the surface of the sealing member 104. The protruding portion 104c may be formed to have various shapes according to the shape of the mold 10 used upon the double injection.

The protruding portion 104c may include an inclined surface 104d curved as the front case 101 is coupled to the rear case 102, and configured to press the front case 101. The structure that the sealing member 104 is curved and elastically pressed may generate a stronger adhesive force than a structure that the front case 101 simply presses the sealing member 104. Also, when the inclined surface 104d having a wider area than the cross section of the sealing member 104 is closely adhered onto the front case 101, the reliability of the sealing structure may be improved.

Hereinafter, description will be given of another exemplary embodiment of the sealing structure for improving sealing efficiency between cases. The foregoing structure may be implemented in combination with the aforementioned structure.

Figure 11:
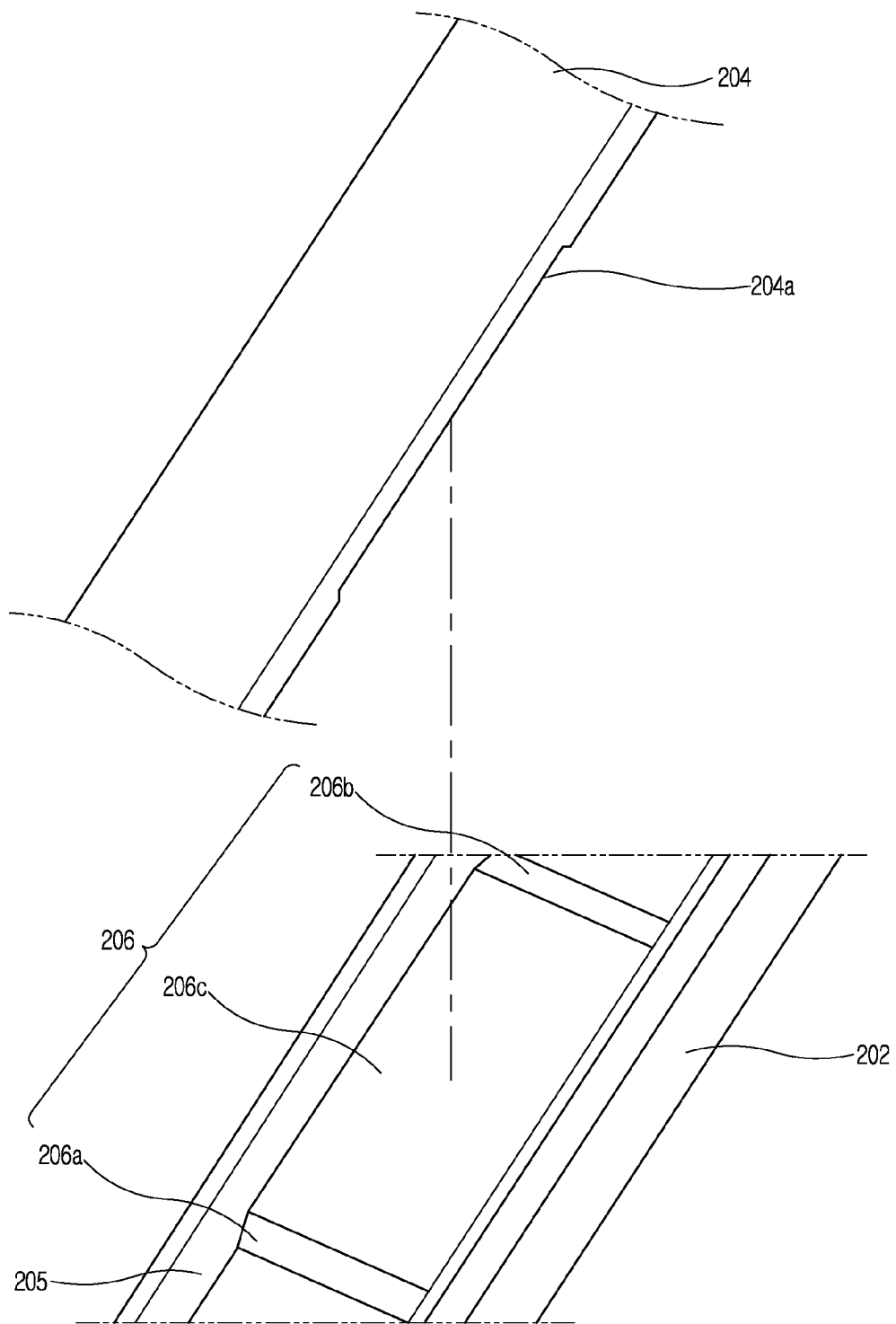
FIG. 11 is a perspective view showing a groove having an inclined portion and a sealing member filled in the groove, in a separate state.

FIG. 11 is a perspective view showing a groove 205 having an inclined portion 206 and a sealing member 204 filled in the groove 205, in a separate state.

Referring to FIG. 11, as aforementioned, the double injection may be carried out to form a rear case 202 that a sealing member 204 is coupled into a groove 205. Here, the sealing member 204 may be injected into the groove 205 through a plurality of gates 20 disposed on the groove 205.

An inclined portion 206 that an inner side of the groove 205 is inclined toward a surface of the groove 205 may be formed between the adjacent gates 20. The inclined portion 206 may have a shape of a curved surface, a linear surface or combination thereof, which is inclined toward the surface of the groove 205. According to the structure, a flowing speed of the sealing member 204 may increase at the inclined portion 206 with a small cross section according to a Bernoulli's theorem. This may result in increasing the flowing speed of the sealing member 204 at a portion where the flowing front ends of the sealing member 204 are joined and welded, thereby reducing the formation of the weld line.

Figure 12:
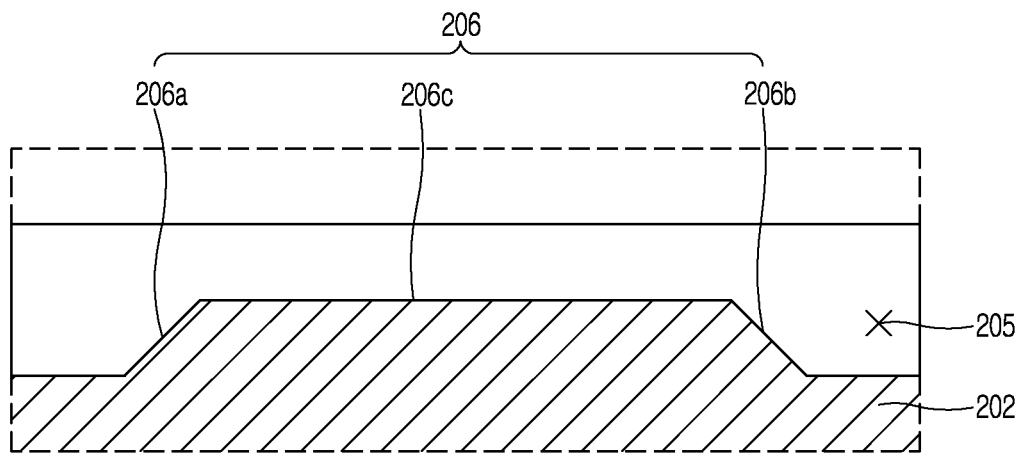
FIGS. 12 and 13 are sectional views of grooves showing various shapes of an inclined portion shown in FIG. 11.
Figure 13:
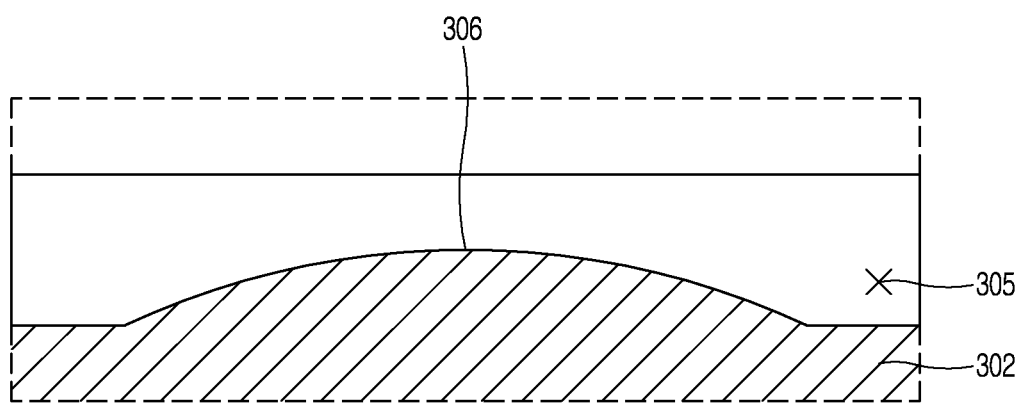

FIGS. 12 and 13 are sectional views of grooves 205 showing various shapes of the inclined portion 206 shown in FIG. 11.

Referring to FIG. 12, the inclined portion 206 may have a trapezoid shape. In detail, the inclined portion 206 may include a first inclined surface 206a and a second inclined surface 206b spaced from each other with a predetermined gap and both inclined toward the surface of the groove 205 in a facing manner, and a connection surface 206c for connecting the first and second inclined surfaces 206a and 206b to each other.

FIG. 11 also illustrates that the inclined portion 206 protrudes in the trapezoid shape and an inner side 204a of the sealing member 204 corresponding to the inclined portion 206 is formed thin. That is, a thickness of the sealing member 204 at the inclined portion 206 may be thinner than a thickness of the sealing member 204 at a portion out of the inclined portion 206. This may increase the flowing speed of the sealing member 204 at the inclined portion 206 during the double injection.

Referring to FIG. 13, an inclined portion 306 may protrude in a shape of a curved surface.

Measuring the filling time with respect to the inclined portions 206 and 306 of two shapes (a linear type is a control group), the inclined portion with the trapezoid shape has exhibited the shortest filling time and the most reduction of the weld line problem. Also, a material cost for the sealing member 204 has been reduced in response to the reduction of the volume of the sealing member 204 as much as the volume of the inclined portion 206.

According to the present disclosure with the configuration, the flow of the sealing member 104 may be controlled such that the surface of the sealing member 104 may be formed earlier than the inner side thereof by way of designing the volumetric center C of the sealing member 104 to be located adjacent to the surface of the sealing member 104. Also, the inclined portion 206 protruding from the inner side of the groove 205 may be formed between adjacent gates 20. Accordingly, a flowing speed (injecting speed) of the sealing member 104 can be controlled such that the sealing member 104 may be filled faster at the inclined portion 206 with a decreasing cross section.

By shifting the position of the volumetric center C and changing the cross section, a non-formation of the sealing member 104, 204 which may be caused between gates 20 or the formation of the weld line on the surface of the sealing member 104, 204 can be overcome, and a more efficient sealing structure may be implemented.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal comprising:
   a first case comprising a groove recessed along one region;
   a second case coupled to the first case, the second case configured to cover the one region; and
   a sealing member filled in the groove, the sealing member adhered onto the second case to seal the one region,
   wherein a volumetric center of the sealing member is located more adjacent to a surface of the sealing member than to an inner side of the sealing member, such that the surface of the sealing member is formed earlier than the inner side of the sealing member to prevent formation of a weld line on the surface of the sealing member.

2. The terminal of claim 1, further comprising a hole formed at the inner side of the groove,
   wherein gas generated due to the filling of the sealing member is gathered toward the inner side of the groove, and
   wherein the hole is configured to discharge the gas formed at the inner side of the groove where the gas is gathered.

3. The terminal of claim 2, further comprising a plurality of adjacent gates disposed on respective sides the groove, wherein the sealing member is filled through the plurality of adjacent gates, and
   wherein the hole is located between the adjacent gates.

4. The terminal of claim 1, wherein a width of the groove extends from the inner side to the surface of the groove.

5. The terminal of claim 1, wherein the sealing member is divided into an upper sealing portion and a lower sealing portion based on the volumetric center of the sealing member, and
   wherein a distance between the volumetric center of the sealing member and a partial volumetric center of the upper sealing portion is shorter than a distance between the volumetric center of the sealing member and a partial volumetric center of the lower sealing portion, such that the upper sealing portion is first formed in the groove.

6. The terminal of claim 5, wherein the upper sealing portion further comprises a protruding portion configured to elastically press the second case when the second case is coupled to the first case.

7. The terminal of claim 6, wherein the protruding portion further comprises an inclined surface which is curved as the second case is coupled to the first case, at least part of the inclined surface being adhered onto the second case to form a seal.

8. The terminal of claim 1, wherein the groove comprises:
   a first groove defining an inner side of the groove; and
   a second groove formed on the first groove to define a surface of the groove, the second groove being externally inclined such that a thickness of the sealing member formed increases.

9. The terminal of claim 8, wherein the first groove has a width increasing toward a direction of the second groove.

10. The terminal of claim 1, wherein the sealing member is filled through a plurality of adjacent gates located on the groove, and wherein an inclined portion in which the inner side of the groove is inclined toward the surface of the groove is formed between the adjacent gates to increase a flowing speed of the sealing member between the adjacent gates.

11. The terminal of claim 10, wherein the inclined portion comprises a shape of at least a curved surface or a linear surface, the at least the curved surface or the linear surface being inclined toward the surface of the groove.

12. The terminal of claim 10, wherein the inclined portion comprises:
   a first inclined surface and a second inclined surface disposed between a spaced gap, the first and second inclined surfaces both inclined toward the surface of the groove in a facing manner; and
   a connection surface configured to connect the first and second inclined surfaces to each other.

13. The terminal of claim 10, wherein a thickness of the sealing member at the inclined portion is thinner than a thickness of the sealing member at a portion out of the inclined portion.

14. The terminal of claim 1, wherein the first case is formed by injecting synthetic resin, and
   wherein the sealing member is formed in the groove by double injection after injecting the first case.

15. The terminal of claim 1, wherein the groove is formed along an inner edge of the first case to form a closed loop.

16. The terminal of claim 1, wherein the groove is formed in the form of a closed loop to surround electronic devices received in the first case.

17. A mobile terminal comprising:
   a first case and a second case coupled to each other to define appearance of a terminal body;
   a groove formed along an inner edge of the first case or the second case; and
   a sealing member filled in the groove through a plurality of adjacent gates located on the groove, the sealing member being pressed when the first and second cases are coupled to each other so as to seal an inner space,
   wherein an inclined portion in which an inner side of the groove is inclined toward a surface of the groove is formed between the adjacent gates to increase a flowing speed of the sealing member between the adjacent gates.

18. The terminal of claim 17, wherein the inclined portion has a shape of at least a curved surface or a linear surface, the at least the curved surface or the linear surface being inclined toward the surface of the groove.

19. The terminal of claim 17, wherein the inclined portion comprises:
   a first inclined surface and a second inclined surface disposed between a spaced gap, the first inclined surface and the second inclined surface both inclined toward the surface of the groove in a facing manner; and
   a connection surface to connect the first and second inclined surfaces to each other.

20. The terminal of claim 17, wherein a thickness of the sealing member at the inclined portion is thinner than a thickness of the sealing member at a portion out of the inclined portion.

21. The terminal of claim 17, wherein pairs of adjacent gates within the plurality of adjacent gates are disposed at respective sides of the groove, the pairs spaced at various points substantially along the perimeter of the groove.

* * * * *